US011875854B2

(12) United States Patent
Yeh et al.

(10) Patent No.: US 11,875,854 B2
(45) Date of Patent: Jan. 16, 2024

(54) MEMORY DEVICE AND WORD LINE DRIVER THEREOF

(71) Applicant: MACRONIX International Co., Ltd., Hsinchu (TW)

(72) Inventors: Teng Hao Yeh, Hsinchu County (TW); Wu-Chin Peng, Hsinchu (TW); Chih-Ming Lin, Hsinchu (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 166 days.

(21) Appl. No.: 17/710,683

(22) Filed: Mar. 31, 2022

(65) Prior Publication Data
US 2023/0317167 A1  Oct. 5, 2023

(51) Int. Cl.
| G11C 11/34 | (2006.01) |
| G11C 8/00 | (2006.01) |
| G11C 16/08 | (2006.01) |
| G11C 16/04 | (2006.01) |
| G11C 16/14 | (2006.01) |
| G11C 16/26 | (2006.01) |
| G11C 16/30 | (2006.01) |

(52) U.S. Cl.
CPC .............. *G11C 16/08* (2013.01); *G11C 16/04* (2013.01); *G11C 16/14* (2013.01); *G11C 16/26* (2013.01); *G11C 16/30* (2013.01)

(58) Field of Classification Search
CPC ......... G11C 16/08; G11C 16/04; G11C 16/14; G11C 16/26; G11C 16/30
See application file for complete search history.

(56) References Cited

U.S. PATENT DOCUMENTS 6,344,764 B2 * 2/2002 Tanzawa .................. G11C 8/08
327/333
6,483,766 B2 * 11/2002 Lee .......................... G11C 5/14
365/230.06

(Continued)

FOREIGN PATENT DOCUMENTS

| EP | 0869509 | 10/1998 |
| EP | 3531423 | 8/2019 |

(Continued)

OTHER PUBLICATIONS

"Search Report of Europe Counterpart Application", dated Oct. 17, 2022, pp. 1-9.

(Continued)

*Primary Examiner* — Hien N Nguyen
(74) *Attorney, Agent, or Firm* — J.C. PATENTS

(57) ABSTRACT

A memory device and a word line driver thereof are provided. The word line driver includes a first word line signal generator, a second word line signal generator, a first voltage generator, and a second voltage generator. The first word line signal generator selects one of a first voltage and a second voltage to generate a first word line signal according a control signal. The second word line signal generator selects one of a third voltage and a fourth voltage to generate a second word line signal according the control signal. The first voltage generator provides the second voltage, and the second voltage generator provides the fourth voltage, where the first voltage generator is independent to the second voltage generator.

20 Claims, 10 Drawing Sheets

(56) References Cited

U.S. PATENT DOCUMENTS

| | | | |
|---|---|---|---|
| 2005/0219903 A1* | 10/2005 | Daga | G11C 5/14 |
| | | | 365/185.18 |
| 2007/0014157 A1* | 1/2007 | Hung | G11C 16/24 |
| | | | 365/185.2 |
| 2010/0165735 A1* | 7/2010 | Hashimoto | G11C 16/30 |
| | | | 365/185.18 |
| 2011/0069558 A1 | 3/2011 | Liao | |
| 2011/0194344 A1 | 8/2011 | Ito | |
| 2016/0225453 A1* | 8/2016 | Kashihara | G11C 16/08 |
| 2019/0267998 A1* | 8/2019 | Okabe | G11C 8/08 |
| 2021/0233596 A1* | 7/2021 | Kamata | G11C 16/3459 |
| 2023/0282277 A1* | 9/2023 | Terada | G11C 13/0028 |
| | | | 365/148 |

FOREIGN PATENT DOCUMENTS

| | | |
|---|---|---|
| TW | I331336 | 10/2010 |
| TW | 201503139 | 1/2015 |

OTHER PUBLICATIONS

"Office Action of Taiwan Counterpart Application", dated Jun. 20, 2022, p. 1-p. 11.

* cited by examiner

MEMORY DEVICE AND WORD LINE DRIVER THEREOF

BACKGROUND

Technical Field

The disclosure relates to a memory device and a word line driver, and more particularly, to a memory device and a word line driver which may perform an erase operation on a memory cell on a selected word line.

Description of Related Art

With the increasing popularity of electronic products, it is an important issue to provide high-efficiency data storage media in electronic products.

In the current flash memory, when data is to be updated, it is necessary to erase the memory cell first, and then perform program operations. Due to architectural limitations, when the erase operation is performed on the memory cells in the flash memory, it is often necessary to erase an entire block of memory cells, and it is impossible to perform the data erase operation on a small number of memory cells. As a result, inconveniences are often caused when the data is updated. For example, when performing calculation of artificial intelligence algorithms, small data updates often occur. Therefore, the feature of only erasing the block results in a significant reduction in the use efficiency of the flash memory.

SUMMARY

The disclosure provides a stacked memory device and a word line driver thereof, which may perform an erase operation on a memory cell on a selected word line.

A word line driver in the disclosure includes a first word line signal generator, a second word line signal generator, a first voltage generator, and a second voltage generator. The first word line signal generator is configured to drive a first word line, and selects one of a first voltage and a second voltage to generate a first word line signal according to a control signal. The second word line signal generator is configured to drive a second word line, and selects one of a third voltage and a fourth voltage to generate a second word line signal according to the control signal. The first voltage generator is coupled to the first word line signal generator to provide the second voltage. The second voltage generator is coupled to the first word line signal generator to provide the fourth voltage. The first voltage generator is independent to the second voltage generator.

According to an embodiment of present disclosure, the word line driver further includes a third voltage generator and a fourth voltage generator. The third voltage generator is coupled to the first word line signal generator to provide the first voltage. The fourth voltage generator is coupled to the second word line signal generator to provide the third voltage.

A stacked memory device in the disclosure includes a word line driver, a first memory cell array, and a second memory cell array. The first memory cell array and the second memory cell array are respectively coupled to multiple first word lines and multiple second word lines. The word line driver includes multiple first word line signal generators, multiple second word line signal generators, a first voltage generator, and a second voltage generator. The first word line signal generators respectively drive the first word lines, and select one of a first voltage and a second voltage to generate multiple first word line signals according to multiple first control signals. The second word line signal generators respectively drive the second word lines, and select one of a third voltage and a fourth voltage to generate multiple second word line signals according to multiple second control signals. The first voltage generator is coupled to the first word line signal generators to provide the second voltage. The second voltage generator is coupled to the first word line signal generators to provide the fourth voltage. The first voltage generator is independent to the second voltage generator.

Based on the above, the word line driver in the disclosure may provide the voltages of the word lines that are independent to one another for different word lines through different word line signal generators. In this way, in the memory device, the memory cells corresponding to different word lines may be erased independently. In other words, the erase operation of the memory device according to the embodiment of the disclosure does not need to be performed on the entire memory cell array, while the erase operation may be performed on the memory cells on some selected word lines, which effectively improves the performance of data access of the memory device.

DETAILED DESCRIPTION OF DISCLOSED EMBODIMENTS

Figure 1:
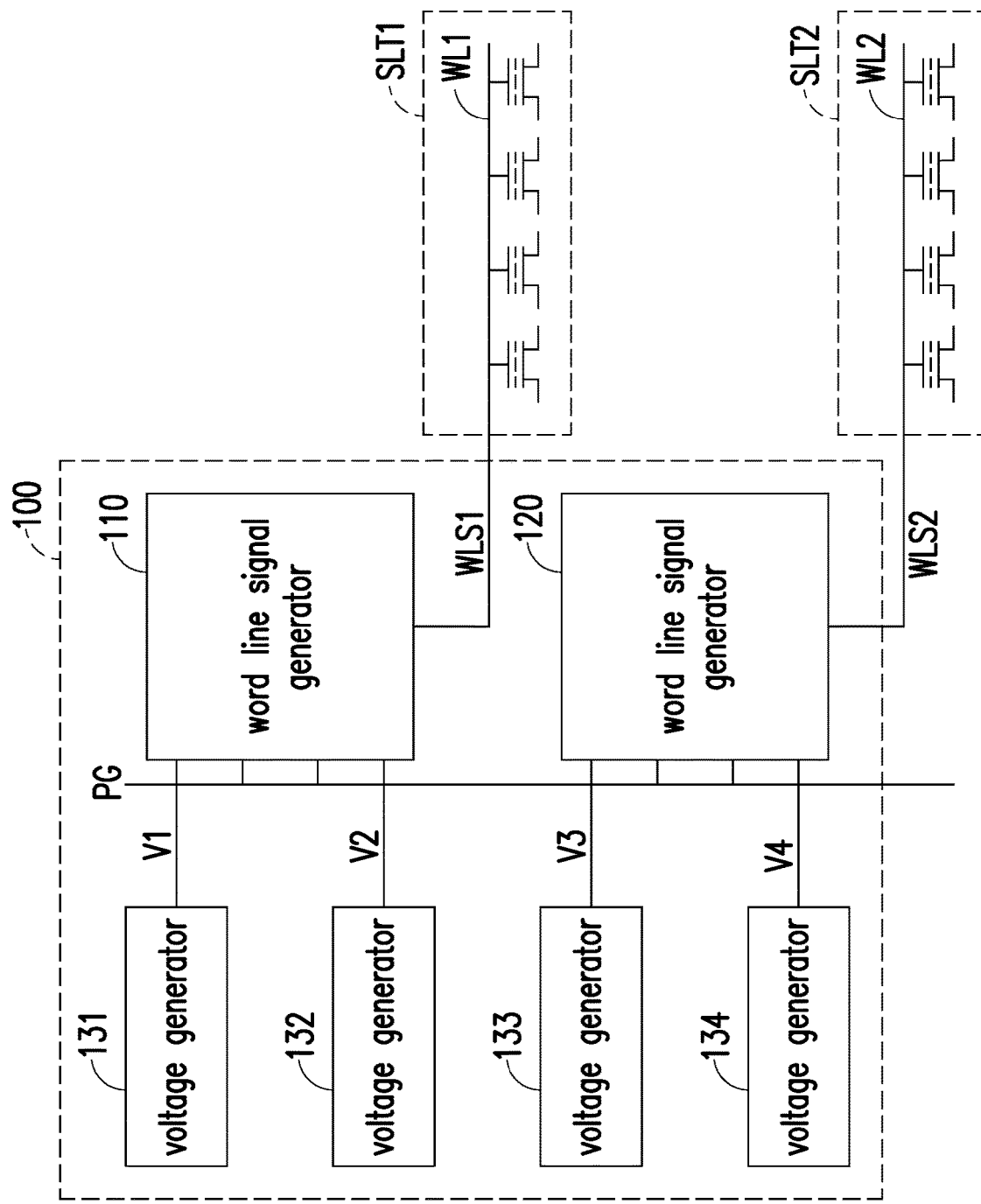
FIG. 1 is a schematic view of a word line driver according to an embodiment of the disclosure.

Referring to FIG. 1, FIG. 1 is a schematic view of a word line driver according to an embodiment of the disclosure. A word line driver 100 includes word line signal generators 110 and 120, and voltage generators 131 to 134. The word line signal generator 110 is configured to drive a word line WL1. The word line signal generator 110 may generate a word line signal WLS1 on the word line WL1 according to a control signal PG. The word line signal generator 110 receives voltages V1 and V2, and the word line signal generator 110 generates the word line signal WLS1 according to one of the voltages V1 and V2 according to the control signal PG. In addition, the word line signal generator 120 is configured to drive a word line WL2. The word line signal generator 120 may generate a word line signal WLS2 on the word line WL2 according to the control signal PG. The word line signal generator 120 receives voltages V3 and V4, and the word line signal generator 120 generates the word line signal WLS2 according to one of the voltages V3 and V4 according to the control signal PG.

The voltage generators 131 and 132 are coupled to the word line signal generator 110. The voltage generators 131 and 132 are respectively configured to generate the voltages V1 and V2. The voltage generators 131 and 132 may respectively adjust voltage values of the voltages V1 and V2 corresponding to different types of access operations performed by a memory device. Similarly, the voltage generators 133 and 134 are coupled to the word line signal generator 120. The voltage generators 134 and 134 are respectively configured to generate the voltages V3 and V4, and may adjust voltage values of the voltages V3 and V4 corresponding to different types of access operations performed by the memory device.

It is worth noting that the voltage value of voltage V1 generated by the voltage generator 131 may be independent to the voltage value of voltage V3 generated by the voltage generator 133. The voltage value of the voltage V2 generated by the voltage generator 132 may also be independent to the voltage value of the voltage V4 generated by the voltage generator 134.

In this embodiment, the word line WL1 is disposed in a memory cell array SLT1, and the word line WL2 may be disposed in another memory cell array SLT2. Of course, the memory cell array SLT1 and the memory cell array SLT2 may also have other word lines. FIG. 1 is merely an example for illustration, and there is no fixed limitation on the number of word lines in the single memory cell array SLT1 and the single memory cell array SLT2.

Herein, it is noted that voltage values of the word line signals WLS1 and WLS2 on the single word line WL1 and the single word line WL2 may be set individually and independently. Therefore, in the embodiment of the disclosure, an erase operation may be performed on one or more memory cells on any one of the word lines (for example, the word line WL1 or WL2) in the memory cell arrays SLT1 and SLT2. In addition, in the memory device, a degree of freedom of data writing in the memory cells is increased, and efficiency of data access is improved.

Figure 2:
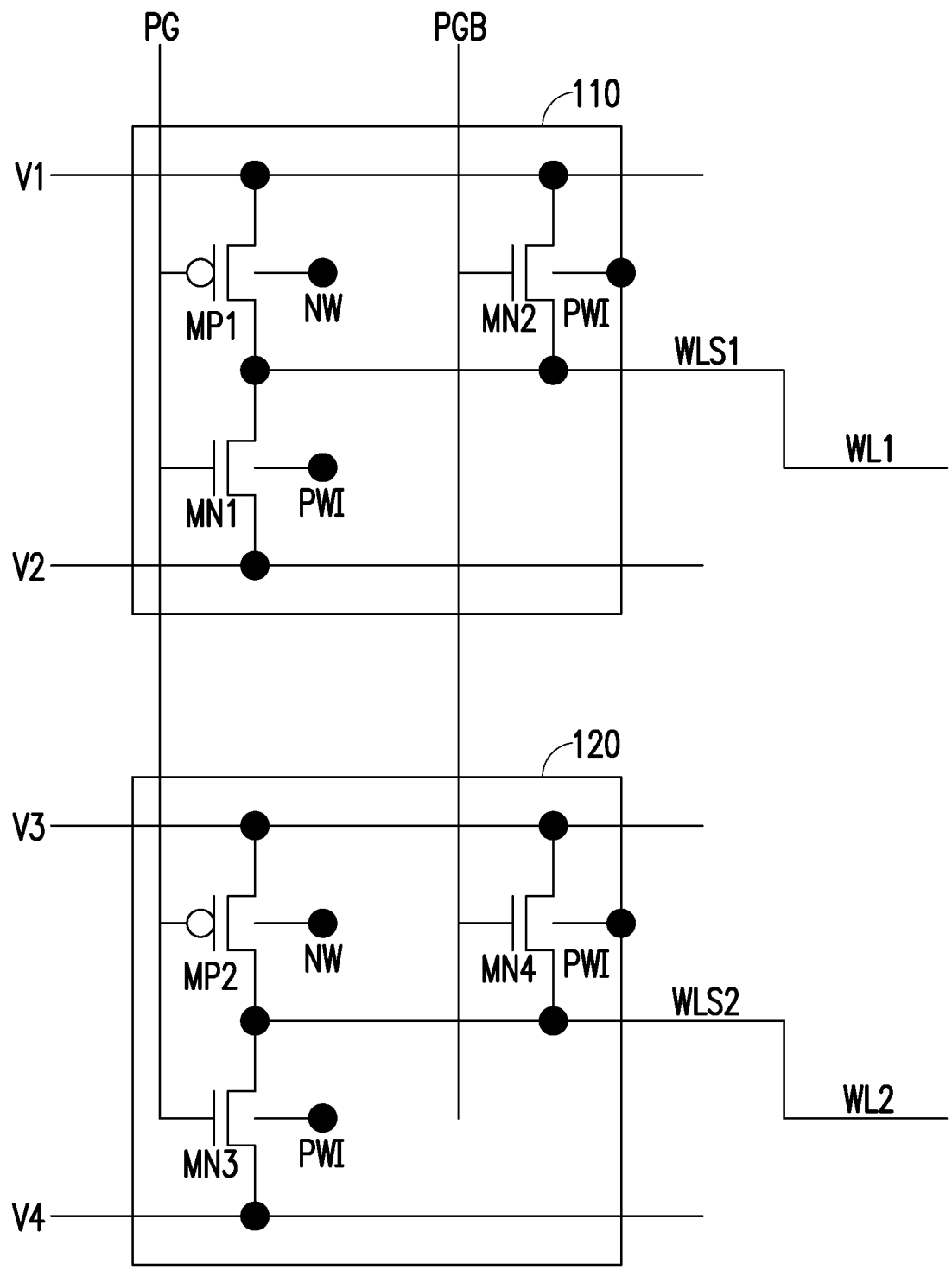
FIG. 2 is a schematic view of implementations of word line signal generators 110 and 120 according to the embodiment of the disclosure in FIG. 1.

Hereinafter, referring to FIG. 2, FIG. 2 is a schematic view of implementations of the word line signal generators 110 and 120 according to the embodiment of the disclosure in FIG. 1. The word line signal generator 110 includes transistors MP1, MN1, and MN2. A first end of the transistor MP1 receives the voltage V1. A control end of the transistor MP1 receives the control signal PG. A second end of the transistor MP1 is coupled to the word line WL1, and is configured to provide the word line signal WLS1. A first end of the transistor MN1 is coupled to the second end of the transistor MP1. A control end of the transistor MN1 receives the control signal PG. A second end of the transistor MN1 receives the voltage V2. In addition, a first end of the transistor MN2 receives the voltage V1. A control end of the transistor MN2 receives a reverse signal PGB of the control signal PG. A second end of the transistor MN2 is coupled to the word line WL1.

The word line signal generator 120 includes transistor MP2, MN3, and MN4. A circuit architecture of the word line signal generator 120 is the same as that of the word line signal generator 110, and thus details in this regard will not be further reiterated in the following.

In this embodiment, the transistors MP1 and MP2 are P-type transistors, and the transistors MN1 to MN4 are N-type transistors.

Regarding actuations of the word line signal generators 110 and 120, the word line signal generator 110 is taken as an example. When the voltage V1 has the relatively high voltage value, and when the control signal PG is at a logic low level, the transistor MP1 may be turned on and transmit the voltage V1 to generate the word line signal WLS1 (in which the transistor MN1 is cut-off at this time). When the voltage V1 has the relatively low voltage value, and when the control signal PG is at the logic low level, the transistor MN2 may be turned on and transmit the voltage V1 to generate the word line signal WLS1. In addition, when the control signal PG is at a logic high level, both the transistors MP1 and MN2 may be cut-off, while the transistor MN1 may be turned on, and transmit the voltage V2 to generate the word line signal WLS1. In this embodiment, the voltage value of the voltage V2 may be equal to or less than the voltage value of the voltage V1.

On the other hand, the transistors MP1, MN1, and MN2 may be formed on a substrate having a triple-well region. In this embodiment, the transistor MP1 may be formed on an N-type well region NW, and the transistors MN1 and MN2 may be formed on a P-type well region PWI. In this way, the word line signal generators 110 and 120 may provide the negative voltages V2 and V4 to respectively generate the word line signals WLS1 and WLS2.

Figure 3:
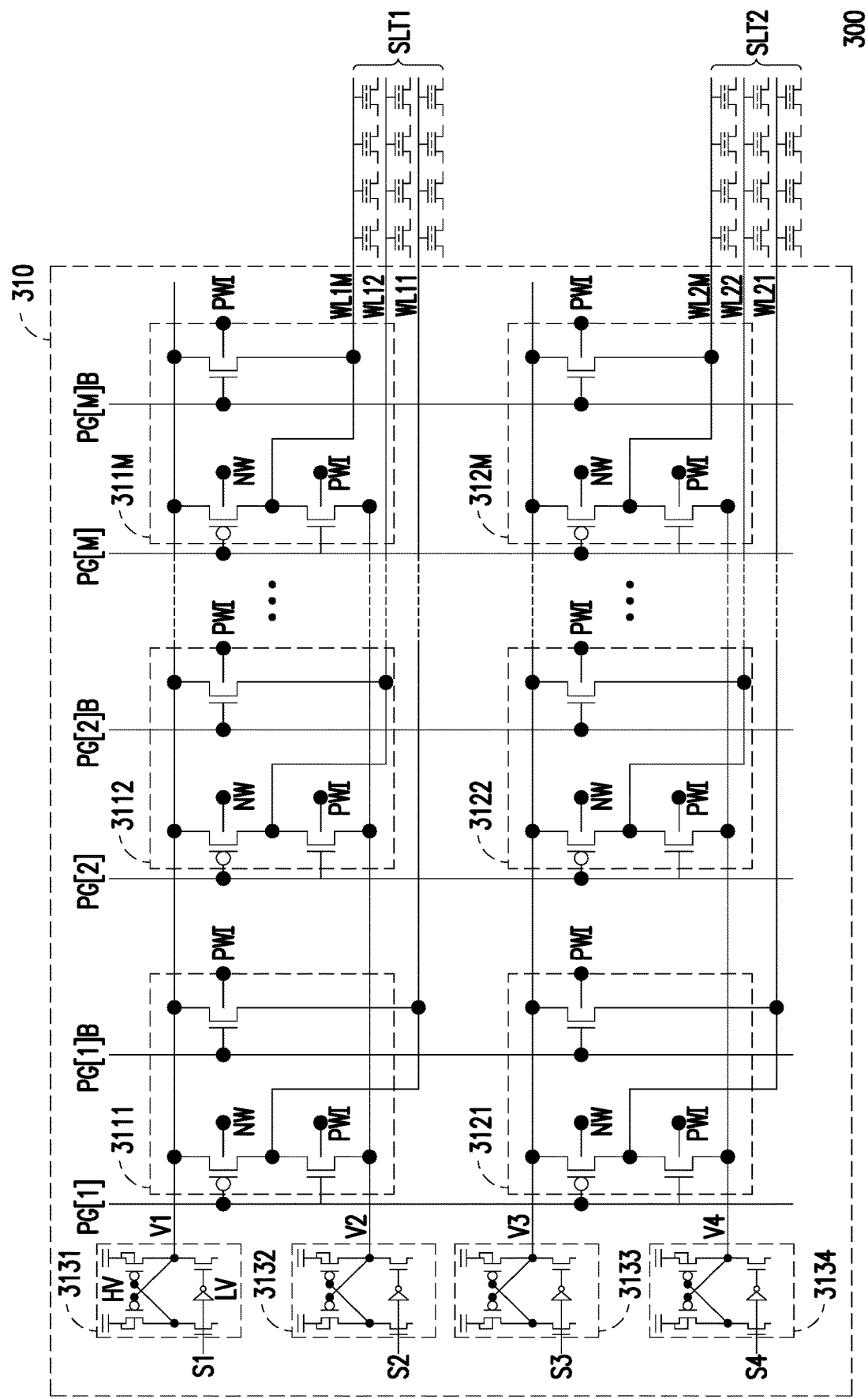
FIG. 3 is a schematic view of a stacked memory device according to an embodiment of the disclosure.

Hereinafter, referring to FIG. 3, FIG. 3 is a schematic view of a stacked memory device according to an embodiment of the disclosure. A stacked memory device 300 includes a word line driver 310 and the memory cell arrays SLT1 and SLT2. The word line driver 310 includes word line signal generators 3111 to 311M and 3121 to 312M, and voltage generators 3131 to 3134. The word line signal generators 3111 to 311M are respectively coupled to word lines WL11 to WL1M, and the word line signal generators 3121 to 312M are respectively coupled to word lines WL21 to WL2M. The word lines WL11 to WL1M are coupled to the memory cell array SLT1, and the word lines WL21 to WL2M are coupled to the memory cell array SLT2.

On the other hand, the word line signal generators 3111 to 311M respectively receive control signals PG[1] to PG[M], and respectively receive reverse signals PG[1]B to PG[M]B of the control signals PG[1] to PG[M]. The word line signal generators 3111 to 311M select one of the voltages V1 and V2 to generate the word line signals to respectively drive the word lines WL11 to WL1M according to the control signals PG[1] to PG[M] and the reverse signals PG[1]B to PG[M]B thereof, so as to perform corresponding data access for the memory cell array SLT1. The word line signal generators 3121 to 312M respectively receive the control signal PG[1] to PG[M], and respectively receive the reverse signals PG[1]B to PG[M]B of the control signals PG[1] to PG[M]. The word line signal generators 3121 to 312M select one of the voltages V3 and V4 to generate the word line signals to respectively drive the word lines WL21 to WL2M according to the control signals PG[1] to PG[M] and the reverse signals PG[1]B to PG[M]B thereof, so as to perform corresponding data access for the memory cell array SLT2.

The voltage generators 3131 to 3134 may be voltage level shifters and respectively receive selection signals S1 to S4. Taking the voltage generator 3131 as an example, the voltage generator 3131 may determine the voltage value of the generated voltage V1 according to a logic level of the selection signal S1. For example, the voltage generator 3131 may receive an operating voltage HV having a relatively high voltage value and an operating voltage LV having a relatively low voltage value. When the selection signal S1 is at the logic high level, the voltage generator 3131 may generate the voltage V1 having the same voltage value (which is the relatively high voltage value) as the operating voltage HV. On the contrary, when the selection signal S1 is at the logic low level, the voltage generator 3131 may generate the voltage V1 having the same voltage value (which is the relatively low voltage value) as the operating voltage LV.

Figure 4:
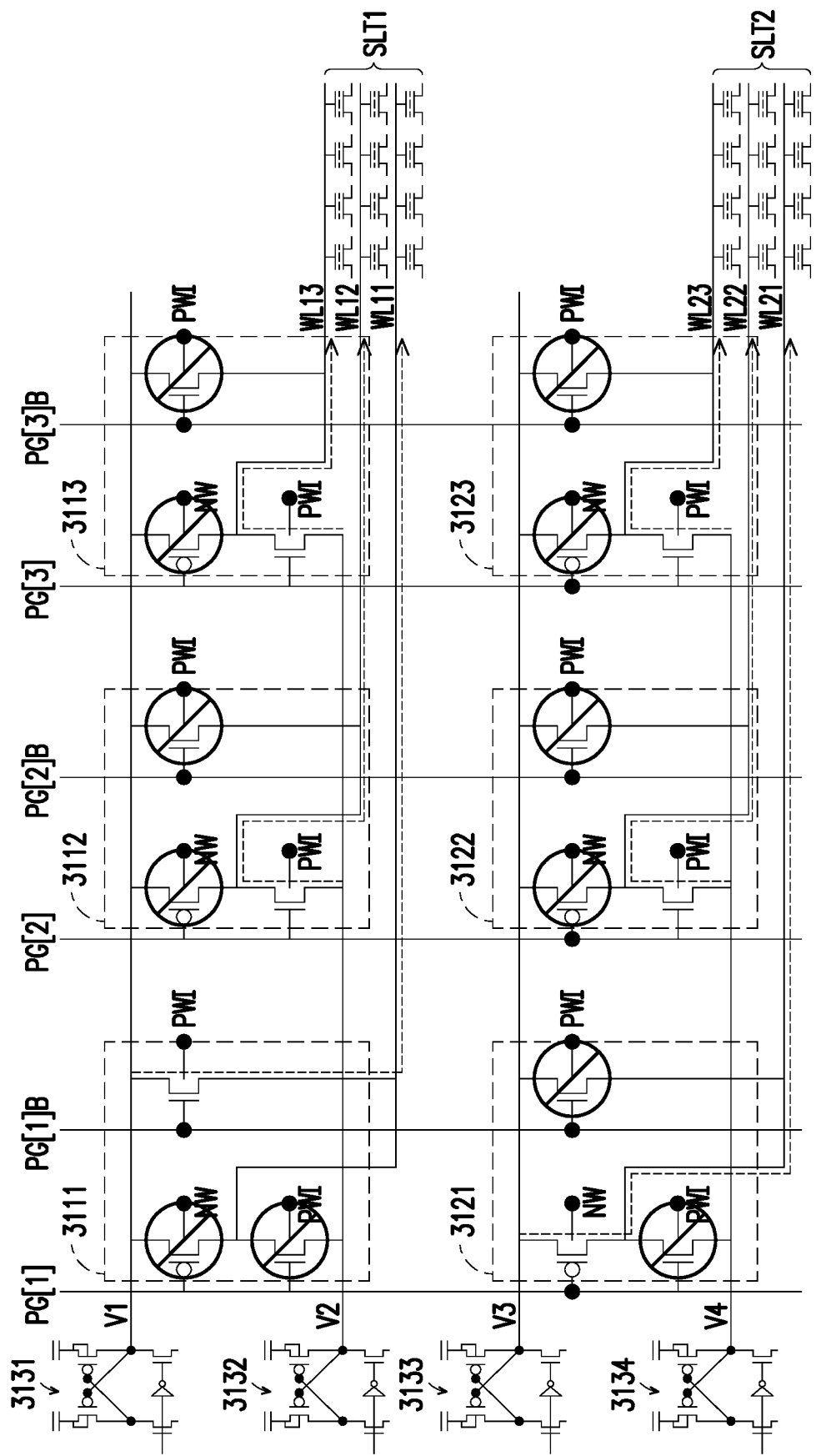
FIG. 4 is a schematic view of a read operation of a stacked memory device according to an embodiment of the disclosure.

Hereinafter, referring to FIG. 4, FIG. 4 is a schematic view of a read operation of a stacked memory device according to an embodiment of the disclosure. A hardware architecture of the stacked memory device 300 in FIG. 3 is taken as an example. In FIG. 4, during the read operation, the voltage generators 3131 and 3132 generate the voltages V1 and V2 having the same voltage value, for example, 0 volts. The voltage generator 3133 generates the voltage V3 having a read voltage value, and the read voltage value is, for example, 7.5 volts. The voltage generator 3134 generates the voltage V4, for example, 0 volts.

In addition, control signals PG[1] to PG[3] may be at logic levels of 0, 1, and 1, respectively, and reverse signals PG[1]B to PG[3]B thereof may be at logic levels of 1, 0, and 0, respectively. According to the voltage values of the voltages V1 to V4, and the control signals PG[1] to PG[3] and the reverse signals PG[1]B to PG[3]B thereof, word line signal generators 3111 to 3113 may generate word line signals of 0 volts to drive word lines WL11 to WL13, and word line signal generators 3121 to 3123 may generate word line signals of 7.5, 0, and 0 volts, respectively, to drive word lines WL21 to WL23. In this way, the word line WL21 may be the selected word line, while the rest of word lines WL11 to WL13, WL22, and WL23 are the unselected word lines.

Figure 5:
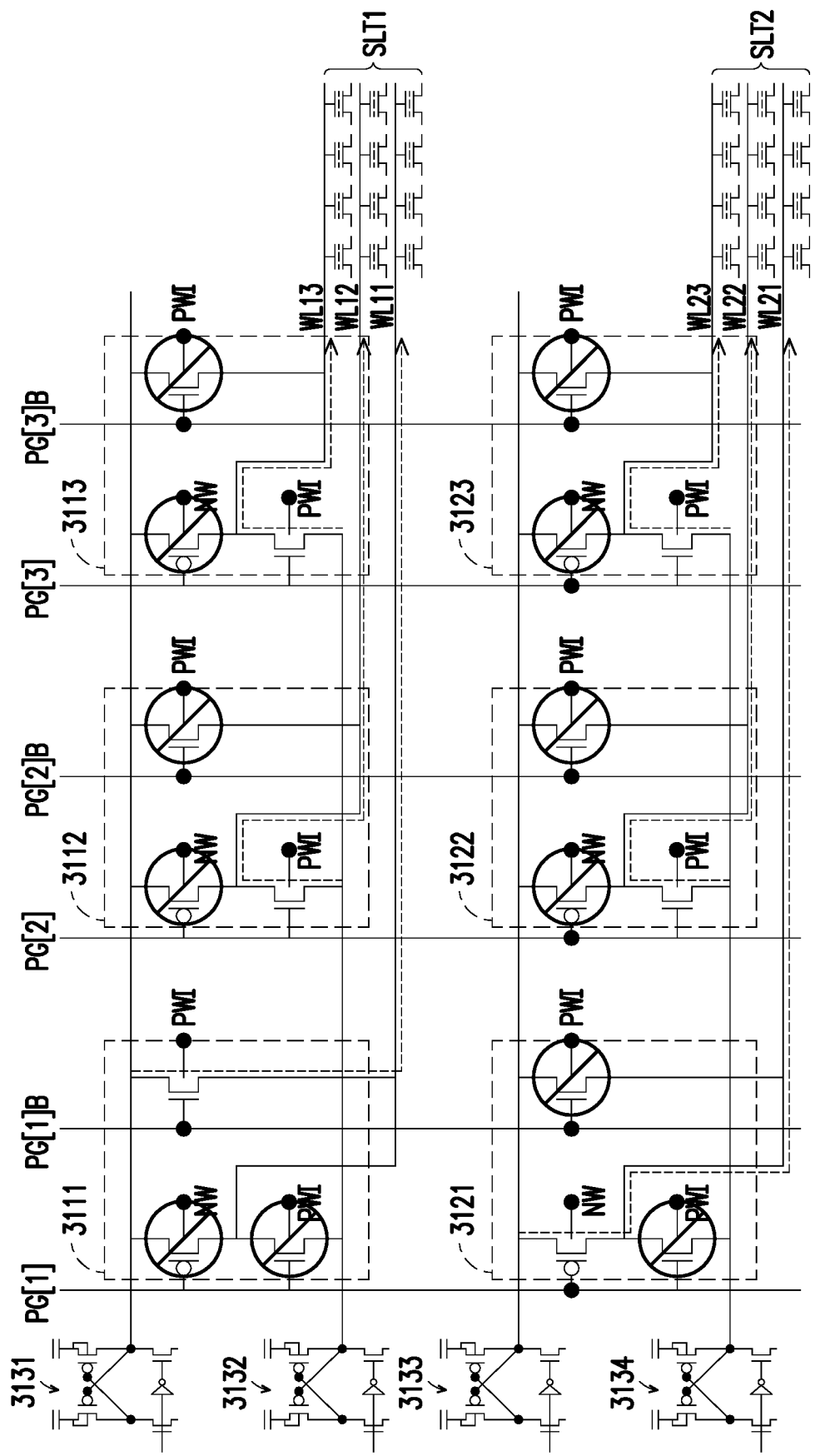
FIG. 5 is a schematic view of a program operation of a stacked memory device according to an embodiment of the disclosure.

Hereinafter, referring to FIG. 5, FIG. 5 is a schematic view of a program operation of a stacked memory device according to an embodiment of the disclosure. Similarly, the hardware architecture of the stacked memory device 300 in FIG. 3 is taken as an example. In FIG. 5, during the program operation, the voltage generators 3131 and 3132 generate the voltages V1 and V2 having the same voltage value, for example, 0 volts. The voltage generator 3133 generates the voltage V3 having a programming voltage value, and the programming voltage value is, for example, 13 volts. The voltage generator 3134 generates the voltage V4, for example, 0 volts.

In addition, the control signals PG[1] to PG[3] may be at the logic levels of 0, 1, and 1, respectively, and the reverse signals PG[1]B to PG[3]B therefore may be at the logic levels of 1, 0, and 0, respectively. According to the voltage values of the voltages V1 to V4, and the control signals PG[1] to PG[3] and the reverse signals PG[1]B to PG[3]B thereof, the word line signal generators 3111 to 3113 may generate the word line signals of 0 volts to drive the word lines WL11 to WL13, and the word line signal generators 3121 to 3123 may generate the word line signals of 13, 0, and 0 volts, respectively, to drive the word lines WL21 to WL23. In this way, the word line WL21 may be the selected word line, while the rest of word lines WL11 to WL13, WL22, and WL23 are the unselected word lines.

Figure 6:
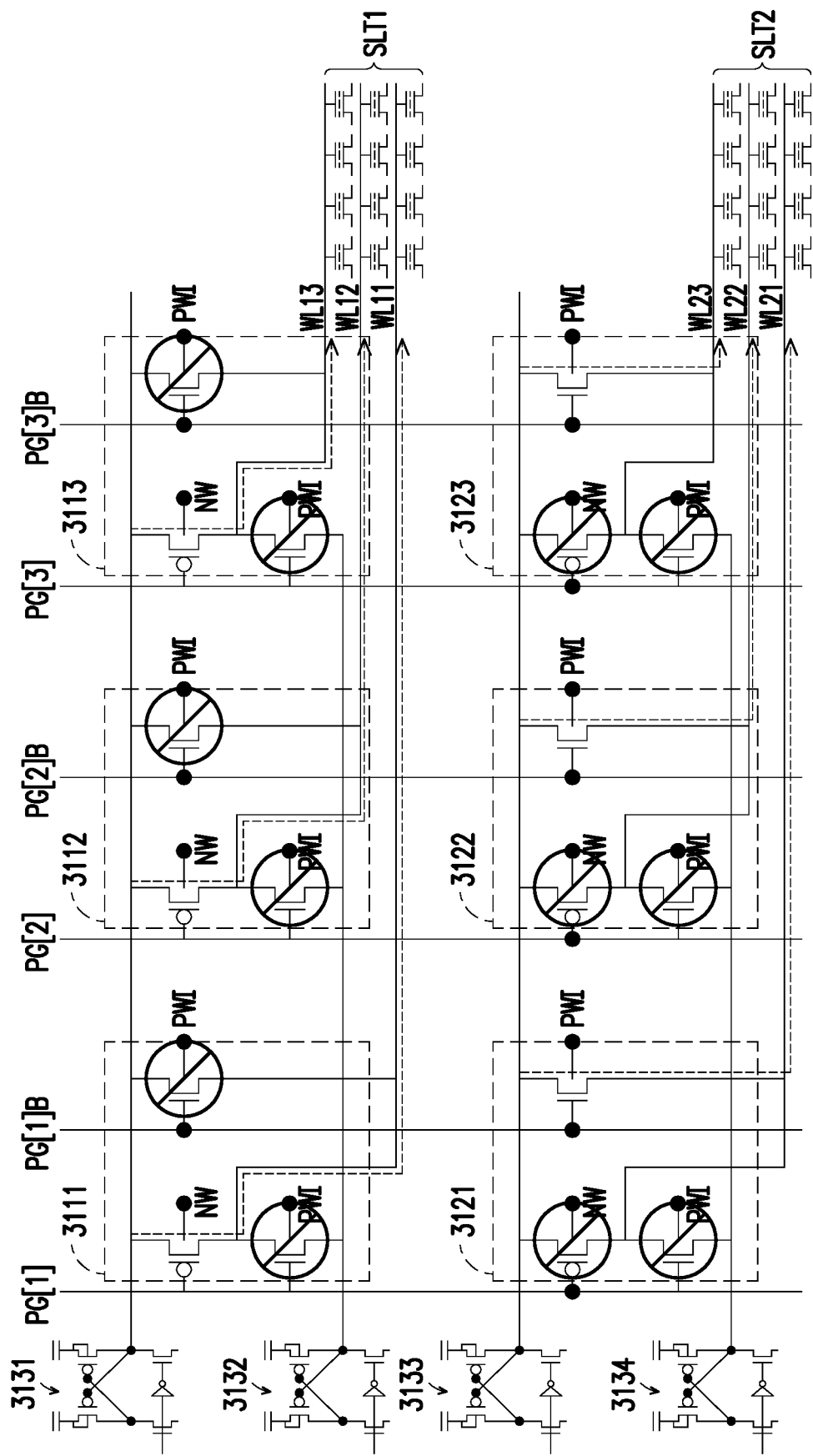
FIG. 6 is a schematic view of a sector erase operation of a stacked memory device according to an embodiment of the disclosure.

Hereinafter, referring to FIG. 6, FIG. 6 is a schematic view of a sector erase operation of a stacked memory device according to an embodiment of the disclosure. Similarly, the hardware architecture of the stacked memory device 300 in FIG. 3 is taken as an example. In FIG. 6, during the sector erase operation, the voltage generator 3131 generates the voltage V1 having a voltage value of, for example, 5 volts, and the voltage generator 3132 generates the voltage V2 having a voltage value of, for example, −8 volts. The voltage generator 3133 generates the voltage V3 having an erase voltage value, and the erase voltage value is, for example, −8 volts. The voltage generator 3134 also generates the voltage V4 having the erase voltage value.

In addition, the control signals PG[1] to PG[3] may be at the logic levels of 0, 0, and 0, respectively, and the reverse signals PG[1]B to PG[3]B thereof may be at the logic levels of 1, 1, and 1, respectively. According to the voltage values of the voltages V1 to V4, and the control signals PG[1] to PG[3] and the reverse signals PG[1]B to PG[3]B thereof, the word line signal generators 3111 to 3113 may generate the word line signals of 5 volts to drive the word lines WL11 to WL13, and the word line signal generators 3121 to 3123 may generate the word line signals of −8 volts to drive the word lines WL21 to WL23. In this way, the word lines WL21 to WL23 may be the selected word lines, while the rest of word lines WL11 to WL13 are the unselected word lines. In other words, all the memory cells in the memory cell array SLT2 may be selected to be erased, and all the memory cells in the memory cell array SLT1 are inhibited and not erased.

Figure 7:
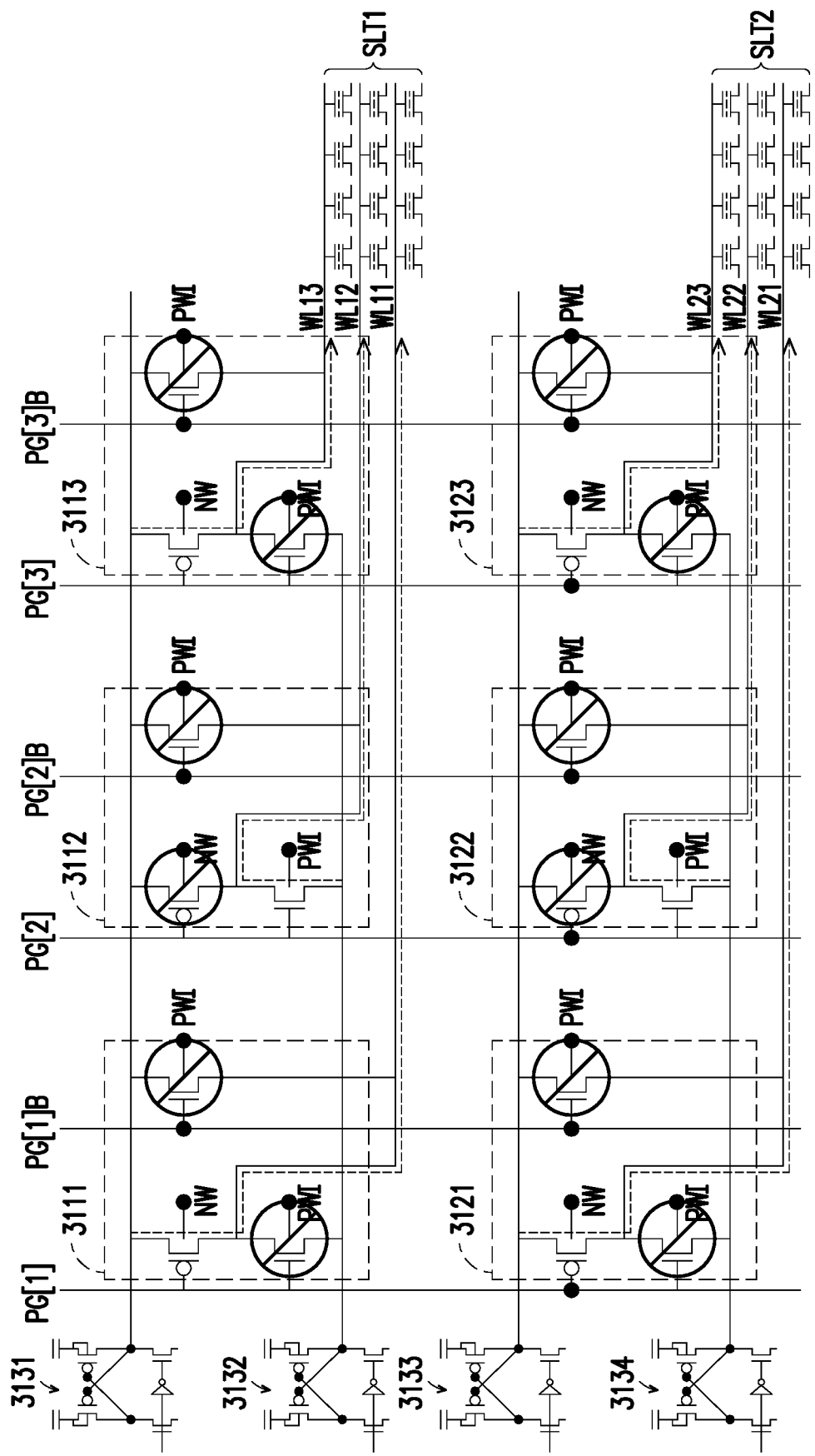
FIG. 7 is a schematic view of an erase operation on a selected word line of a stacked memory device according to an embodiment of the disclosure.

Hereinafter, referring to FIG. 7, FIG. 7 is a schematic view of an erase operation on a selected word line of a stacked memory device according to an embodiment of the disclosure. Similarly, the hardware architecture of the stacked memory device 300 in FIG. 3 is taken as an example. In FIG. 7, during the erase operation on the selected word line, the voltage generator 3131 generates the voltage V1 having the voltage value of, for example, 5 volts, and the voltage generator 3132 generates the voltage V2 having the voltage value of, for example, 5 volts. The voltage generator 3133 generates the voltage V3 having the voltage value of, for example, 5 volts. The voltage generator 3134 generates the voltage V4 having the erase voltage value, and the erase voltage value is, for example, −8 volts.

In addition, the control signals PG[1] to PG[3] may be at the logic levels of 0, 1, and 0, respectively, and the reverse signals PG[1]B to PG[3]B thereof may be at the logic levels of 1, 0, and 1, respectively. According to the voltage values of the voltages V1 to V4, and the control signals PG[1] to PG[3] and the reverse signals PG[1]B to PG[3]B thereof, the word line signal generators 3111 to 3113 may generate the word line signals of 5, 3, and 5 volts, respectively, to drive the word lines WL11 to WL13, and the word line signal generators 3121 to 3123 may generate the word line signals of 5, −8, and 5 volts, respectively, to drive the word lines WL21 to WL23. In this way, the word line WL22 may be the selected word line, while the rest of word lines WL11 to WL13, WL21, and WL23 are the unselected word lines. In other words, only the memory cells corresponding to the single word line WL22 may be erased, and the rest of memory cells may be inhibited and not erased.

In other words, in this embodiment, by setting one of the control signals PG[1] to PG[3] to be at the logic level of 1, and using the voltage generator 3132 or 3134 to provide the erase voltage value, the word line on which the erase operation is to be performed may be selected, and the erase operation is performed for all or a part of the memory cells on the single word line.

It is worth mentioning that in this embodiment, the word line signal generator 3112 transmits the voltage V2 to generate the word line signal to drive the word line WL22 by turning on the N-type transistor below. Based on a body effect of the N-type transistor, the word line signal generated by the word line signal generator 3112 may be slightly lower than the voltage V2, and may be equal to 3 volts.

Figure 8:
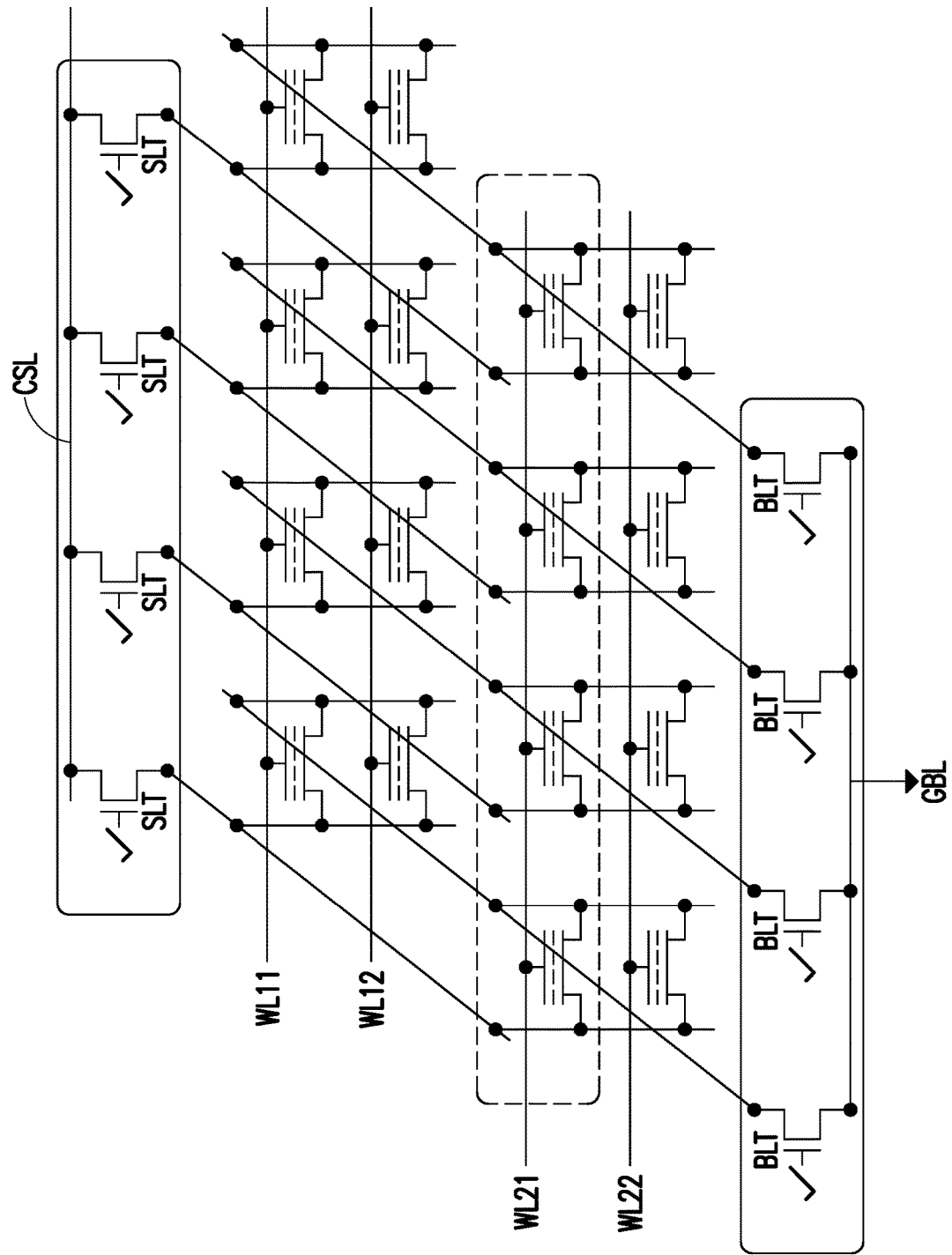
FIGS. 8 and 9 are respectively schematic views of an erase method of one or more memory cells in an erase operation on a selected word line according to an embodiment of the disclosure.
Figure 9:
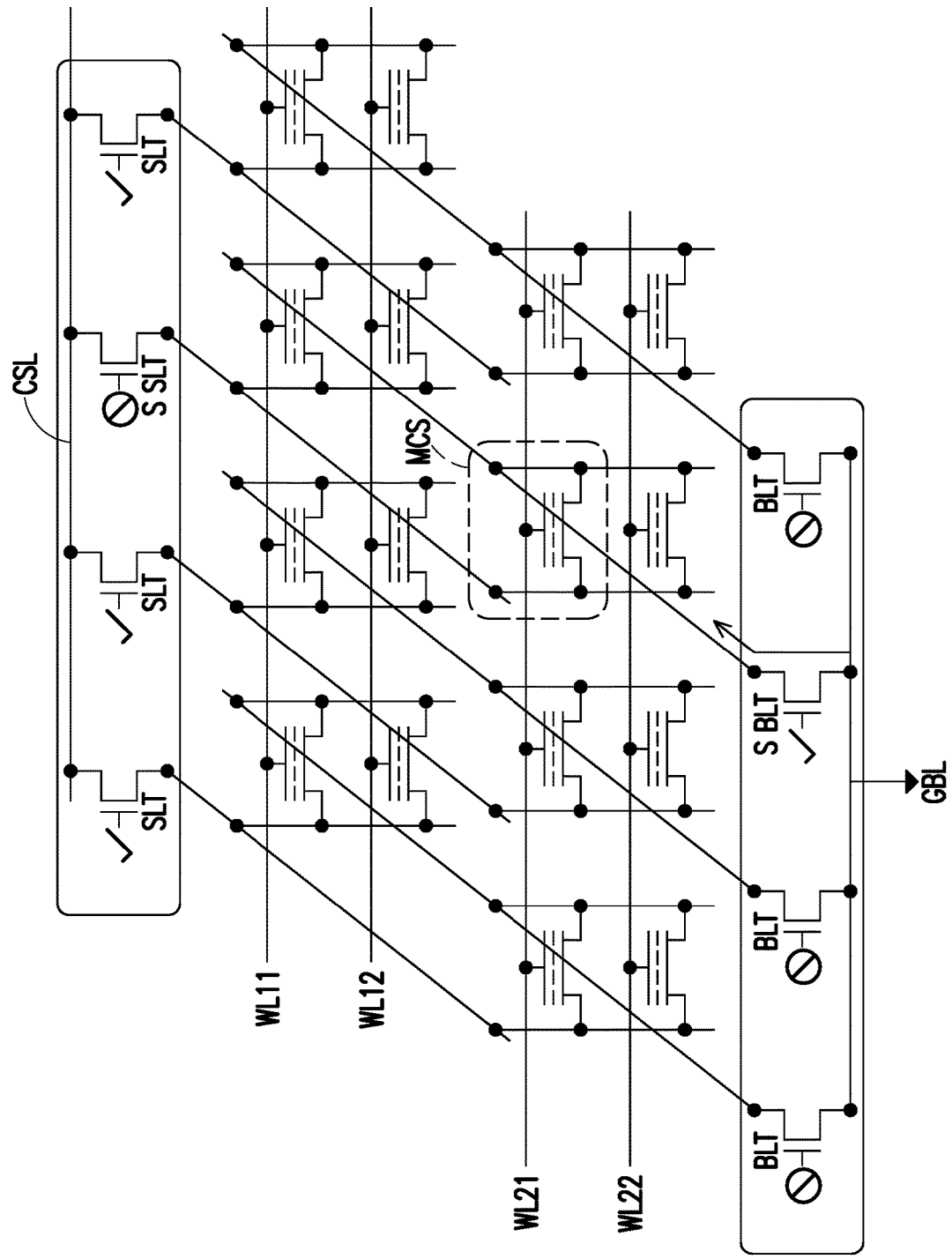

Hereinafter, referring to FIGS. 8 and 9, FIGS. 8 and 9 are respectively schematic views of an erase method of one or more memory cells in an erase operation on a selected word line according to an embodiment of the disclosure. In FIG. 8, corresponding to the embodiment of FIG. 7, when the word line WL21 is set to be the selected word line, all the memory cells on the word line WL21 may be erased by turning on both a source line switch SLT and a bit line switch BLT. In this embodiment, the word line signal on the word line WL21 is, for example, −8 volts, and the word line signals on the rest of unselected word lines WL11, WL12, and WL22 are, for example, 5 volts. In addition, in this embodiment, the source line switch SLT is coupled between a source end of the memory cell and a common source line CSL, and the bit line switch BLT is coupled between a bit line end of the memory cell and a common bit line GBL. When the erase operation is performed, a voltage on the common bit line GBL is, for example, 5 to 8 volts.

In this embodiment, the memory cell arrays corresponding to the word lines WL11 and WL12 and the memory cell arrays corresponding to the word lines WL21 and WL22 are all three-dimensional stacked AND flash memory cell arrays.

In FIG. 9, also corresponding to the embodiment of FIG. 7, when the word line WL21 is set to be the selected word line, and only a selected memory cell MCS is to be erased, by cutting off a selected source line switch SSLT corresponding to the selected memory cell MCS and turning on other source line switches SLT, a selected bit line switch SBLT corresponding to the selected memory cell MCS is turned on, and other bit line switches BLT are cut-off, so that the selected memory cell MCS may be erased. In other words, by adjusting a turn-on or cut-off state of the source line switches and the bit line switches, any one or more memory cells on the word lines may be selected to perform the erase operation.

In this embodiment, the word line signal on the word line WL21 is, for example, −8 volts, and the word line signals on the rest of unselected word lines WL11, WL12, and WL22 are, for example, 5 volts. In addition, in this embodiment, the source line switch SLT is coupled between the source end of the memory cell and the common source line CSL, and the bit line switch BLT is coupled between the bit line end of the memory cell and the common bit line GBL. When the erase operation is performed, the voltage on the common bit line GBL is, for example, 5 to 8 volts.

Figure 10:
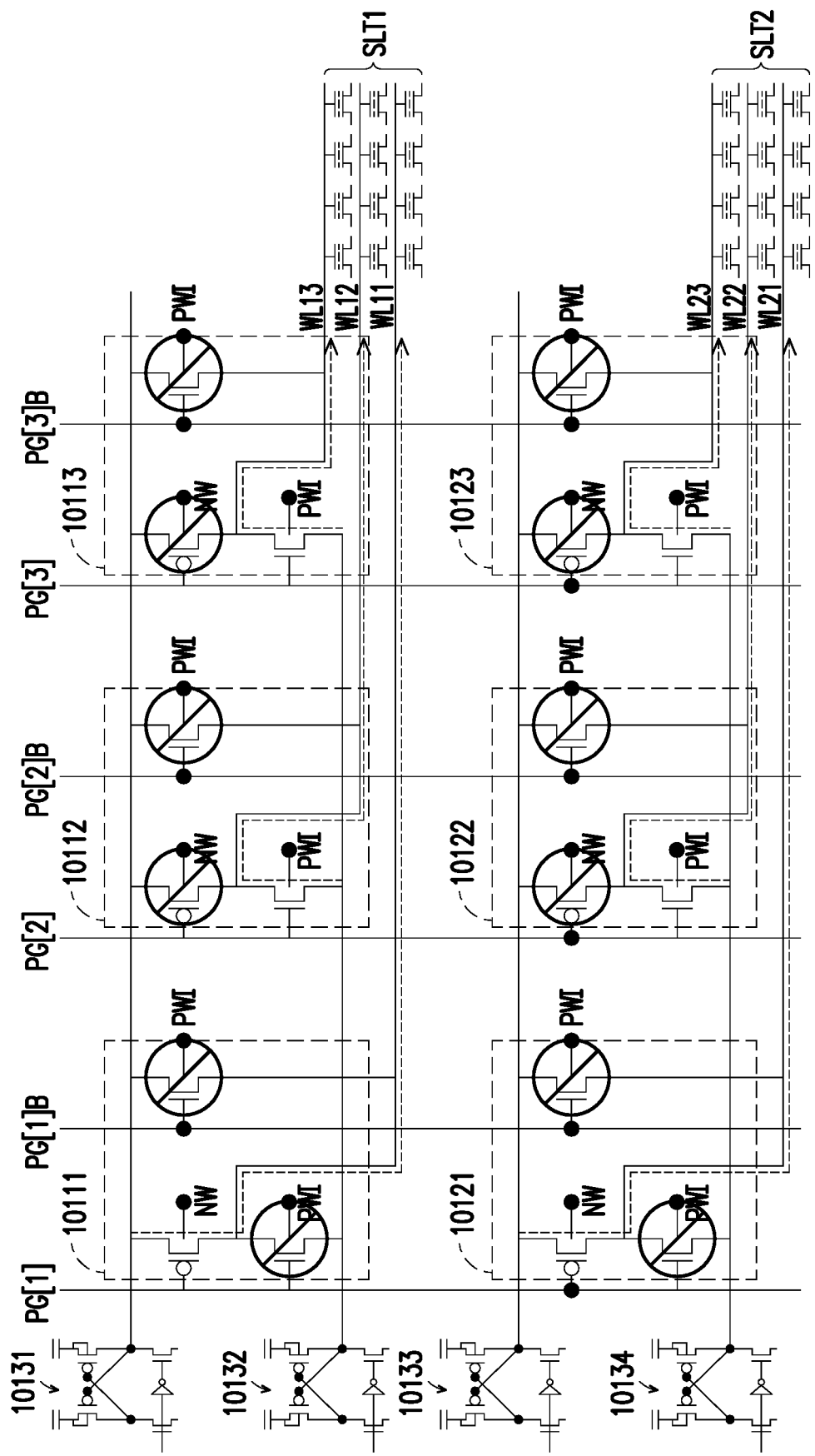
FIG. 10 is a schematic view of an erase operation on any bit line of a memory device according to an embodiment of the disclosure.

Hereinafter, referring to FIG. 10, FIG. 10 is a schematic view of an erase operation on any bit line of a memory device according to an embodiment of the disclosure. In FIG. 10, during the erase operation on any selected word line, a voltage generator 10131 generates the voltage V1 having the voltage value of, for example, 5 volts, and a voltage generator 10132 generates the voltage V2 having the voltage value of, for example, 5 volts. A voltage generator 10133 generates the voltage V3 having the voltage value of, for example, 5 volts. A voltage generator 10134 generates the voltage V4 having the erase voltage value, and the erase voltage value is, for example, −8 volts.

In addition, the control signals PG[1] to PG[3] may be at the logic levels of 0, 1, and 1, respectively, and the reverse signals PG[1]B to PG[3]B thereof may be at the logic levels of 1, 0, and 0, respectively. According to the voltage values of the voltages V1 to V4, and the control signals PG[1] to PG[3] and the reverse signals PG[1]B to PG[3]B thereof, word line signal generators 10111 to 10113 may generate the word line signals of 5, 3, and 3 volts, respectively, to drive the word lines WL11 to WL13, and word line signal generators 10121 to 10123 may generate the word line signals of 5, −8, and −8 volts, respectively, to drive the word lines WL21 to WL23. In this way, the word lines WL22 and WL23 may be the selected word lines, while the rest of word lines WL11 to WL13, and WL21 are the unselected word lines.

According to the above description, in this embodiment, any one or more word lines may be selected so that the corresponding memory cells may be erased, and the rest of memory cells may be inhibited and not be erased.

Based on the above, the word line signal generators in the disclosure may generate the word line signals on different word lines according to the voltages independent to one another. By adjusting the voltage value of each of the word line signals, during the erase operation, the erase operation may be performed on the memory cells on one or more selected word lines, which effectively improves the degree of freedom of data writing in the memory device and improves the performance of data access of the memory device.

What is claimed is:

1. A word line driver, comprising:
a first word line signal generator configured to drive a first word line, and selecting one of a first voltage and a second voltage to generate a first word line signal according to a control signal;
a second word line signal generator configured to drive a second word line, and selecting one of a third voltage and a fourth voltage to generate a second word line signal according to the control signal;
a first voltage generator coupled to the first word line signal generator to provide the second voltage; and
a second voltage generator coupled to the first word line signal generator to provide the fourth voltage, wherein the first voltage generator is independent to the second voltage generator.

2. The word line driver according to claim 1, further comprising:
a third voltage generator coupled to the first word line signal generator to provide the first voltage; and
a fourth voltage generator coupled to the second word line signal generator to provide the third voltage.

3. The word line driver according to claim 2, wherein each of the third voltage generator and the fourth voltage generator is a voltage level shifter, the third voltage generator determines a voltage value of the first voltage according to a logic level of a first selection signal, and the fourth voltage generator determines a voltage value of the third voltage according to a second a logic level of a second selection signal.

4. The word line driver according to claim 1, wherein during a read operation, a voltage value of the first voltage is the same as a voltage value of the second voltage, and the first word line signal generator generates the first word line signal, so that the first word line is an unselected word line; the third voltage is a read voltage value, a voltage value of the fourth voltage is the same as the voltage value of the first voltage, and the second word line signal generator enables the second word line signal to be equal to the read voltage value, so that the second word line is a selected word line, or enables the second word line signal to be equal to the fourth voltage, so that the second word line is the unselected word line.

5. The word line driver according to claim 1, wherein during a program operation, a voltage value of the first voltage is the same as a voltage value of the second voltage, and the first word line signal generator generates the first word line signal, so that the first word line is an unselected word line; the third voltage is a programming voltage value, a voltage value of the fourth voltage is the same as the voltage value of the first voltage, and the second word line signal generator enables the second word line signal to be equal to the programming voltage value, so that the second word line is a selected word line, or enables the second word line signal to be equal to the fourth voltage, so that the second word line is the unselected word line.

6. The word line driver according to claim 1, wherein during a sector erase operation, the first voltage is greater than the second voltage, and the first word line signal generator enables the first word line signal to be equal to the first voltage, so that the first word line is an unselected word line; the third voltage is equal to an erase voltage value, and the second word line signal generator enables the second word line signal to be equal to the erase voltage value, so that the second word line is a selected word line.

7. The word line driver according to claim 1, wherein during an erase operation on a selected word line, the first voltage is equal to the second voltage, the first word line signal generator generates the first word line signal according to the second voltage and enables the first word line to be an inhibited word line, and the second word line signal generator enables the second word line signal to be equal to an erase voltage value, so that the second word line is the selected word line.

8. The word line driver according to claim 7, wherein the erase voltage value is less than 0.

9. The word line driver according to claim 1, wherein each of the first word line signal generator and the second word line signal generator comprises:
a first transistor having a first end receiving the first voltage or the third voltage, wherein a control end of the first transistor receives the control signal, and a second end of the first transistor is coupled to the corresponding word line;
a second transistor having a first end coupled to the second end of the first transistor, wherein a control end of the second transistor receives the control signal, and a second end of the second transistor receives the second voltage or the fourth voltage; and
a third transistor having a first end coupled to the first end of the first transistor, wherein a control end of the third transistor receives a reverse signal of the control signal, and a second end of the third transistor is coupled to the second end of the first transistor.

10. The word line driver according to claim 9, wherein the first transistor is a P-type transistor, and the second transistor and the third transistor are N-type transistors.

11. The word line driver according to claim 10, wherein the first transistor is disposed on an N-type well region, and the second transistor and the third transistor are disposed on a P-type well region.

12. The word line driver according to claim 1, wherein each of the first voltage generator and the second voltage generator is a voltage level shifter, the first voltage generator determines a voltage value of the second voltage according to a logic level of a first selection signal, and the second voltage generator determines a voltage value of the fourth voltage according to a logic level of a second selection signal.

13. The word line driver according to claim 1, wherein the first word line signal generator and the second word line signal generator are both disposed on a substrate having a triple-well region.

14. A stacked memory device, comprising:
a word line driver, comprising:
a plurality of first word line signal generators configured to respectively drive a plurality of first word lines, and selecting one of a first voltage and a second voltage to generate a plurality of first word line signals according to a plurality of first control signals;
a plurality of second word line signal generators configured to respectively drive a plurality of second word lines, and selecting one of a third voltage and a fourth voltage to generate a plurality of second word line signals according to a plurality of second control signals;
a first voltage generator coupled to the first word line signal generators to provide the second voltage; and
a second voltage generator coupled to the first word line signal generators to provide the fourth voltage, wherein the first voltage generator is independent to the second voltage generator; and
a first memory cell array coupled to the first word lines; and
a second memory cell array coupled to the second word lines.

15. The stacked memory device according to claim 14, wherein the first memory cell array and the second memory cell array are three-dimensional AND flash memory cell arrays.

16. The stacked memory device according to claim 14, further comprising:
a third voltage generator coupled to the first word line signal generators to provide the first voltage; and
a fourth voltage generator coupled to the second word line signal generators to provide the third voltage,
wherein each of the first voltage generator and the second voltage generator is a first voltage level shifter, the first voltage generator determines a voltage value of the second voltage according to a logic level of a first selection signal, and the second voltage generator determines a voltage value of the fourth voltage according to a logic level of a second selection signal; each of the third voltage generator and the fourth voltage generator is a second voltage level shifter, the third voltage generator determines a voltage value of the first voltage according to a logic level of a third selection signal, and the fourth voltage generator a voltage value of the third voltage according to a logic level of a fourth selection signal.

17. The stacked memory device according to claim 14, wherein during a read operation, a voltage value of the first voltage is the same as a voltage value of the second voltage, and each of the first word line signal generators generates each of the first word line signals, so that each of the first word lines is an unselected word line; the third voltage is a read voltage value, a voltage value of the fourth voltage is the same as the voltage value of the first voltage, and each of the second word line signal generators enables each of the second word line signals to be equal to the read voltage value, so that each of the second word lines is a selected word line, or enables each of the second word line signals to be equal to the fourth voltage, so that each of the second word lines is the unselected word line.

18. The stacked memory device according to claim 14, wherein during a program operation, a voltage value of the first voltage is the same as a voltage value of the second voltage, and each of the first word line signal generators generates each of the first word line signals, so that each of the first word lines is an unselected word line; the third voltage is a programming voltage value, a voltage value of the fourth voltage is the same as the voltage value of the first voltage, and each of the second word line signal generators enables each of the second word line signals to be equal to the programming voltage value, so that each of the second word lines is a selected word line, or enables each of the second word line signals to be equal to the fourth voltage, so that each of the second word lines is the unselected word line.

19. The stacked memory device according to claim 14, wherein during a sector erase operation, the first voltage is greater than the second voltage, and each of the first word line signal generators enables each of the first word line signals to be equal to the first voltage, so that each of the first word lines is an unselected word line; the third voltage is equal to an erase voltage value, and each of the second word line signal generators enables each of the second word line signals to be equal to the erase voltage value, so that each of the second word lines is a selected word line.

20. The stacked memory device according to claim 14, wherein during an erase operation on a selected word line, the first voltage is equal to the second voltage, each of the first word line signal generators generates each of the first word line signals according to the second voltage and enables each of the first word lines to be an inhibited word line, and each of the second word line signal generators enables each of the second word line signals to be equal to an erase voltage value, so that each of the second word lines is the selected word line.

* * * * *